United States Patent
Chiu et al.

(10) Patent No.: US 9,159,690 B2
(45) Date of Patent: Oct. 13, 2015

(54) TALL SOLDERS FOR THROUGH-MOLD INTERCONNECT

(71) Applicant: Intel Corporation, Santa Clara, CA (US)

(72) Inventors: Chia-Pin Chiu, Tempe, AZ (US); Xiaorong Xiong, Chandler, AZ (US); Linda Zhang, Chandler, AZ (US); Robert Nickerson, Chandler, AZ (US); Charles Gealer, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/036,755

(22) Filed: Sep. 25, 2013

(65) Prior Publication Data

US 2015/0084192 A1     Mar. 26, 2015

(51) Int. Cl.
*H01L 23/00* (2006.01)

(52) U.S. Cl.
CPC ............... *H01L 24/17* (2013.01); *H01L 24/81* (2013.01); *H01L 2224/1703* (2013.01)

(58) Field of Classification Search
CPC .. H01L 24/17; H01L 24/81; H01L 2224/1703
USPC ......... 257/686, 777, 723, 685, 773, 774, 778, 257/737, 738, 734, 780, 783, 779
See application file for complete search history.

(56) References Cited

U.S. PATENT DOCUMENTS

| | | | |
|---|---|---|---|
| 5,102,829 A | 4/1992 | Cohn | |
| 5,111,278 A | 5/1992 | Eichelberger | |
| 5,497,033 A | 3/1996 | Fillion et al. | |
| 5,703,400 A | 12/1997 | Wojnarowski et al. | |
| 5,745,984 A | 5/1998 | Cole, Jr. et al. | |
| 5,903,052 A | 5/1999 | Chen et al. | |
| 6,154,366 A | 11/2000 | Ma et al. | |

(Continued)

FOREIGN PATENT DOCUMENTS

| CN | 104025289 A | 9/2014 |
|---|---|---|
| DE | 102011053161 A1 | 3/2012 |

(Continued)

OTHER PUBLICATIONS

U.S. Appl. No. 13/631,205, Preliminary Amendment filed Dec. 12, 2012, 3 pgs.

(Continued)

*Primary Examiner* — Alexander Oscar Williams
(74) *Attorney, Agent, or Firm* — Schwegman Lundberg & Woessner, P.A.

(57) ABSTRACT

Generally discussed herein are systems and apparatuses that include an extended TSBA ball and techniques for making the same. A package can include a chip package situated below a lower surface of a first substrate, the package including a die situated on a top surface of a second substrate, a molding disposed over the upper surface of the second substrate, the molding extending over the second die and including an opening extending from an upper surface of the molding towards an upper surface of the second substrate, wherein the opening is configured to admit at least a portion of the solder ball, and a solder column electrically and mechanically coupled to the second substrate, situated in the opening, conforming to the cylinder, and including at least two layers of solder with flux therebetween.

10 Claims, 9 Drawing Sheets

(56) References Cited

U.S. PATENT DOCUMENTS

| | | | |
|---|---|---|---|
| 6,229,203 B1 | 5/2001 | Wojnarowski | |
| 6,271,469 B1 | 8/2001 | Ma et al. | |
| 6,495,914 B1 | 12/2002 | Sekine et al. | |
| 6,506,632 B1 | 1/2003 | Cheng et al. | |
| 7,042,081 B2 | 5/2006 | Wakisaka et al. | |
| 7,189,596 B1 | 3/2007 | Mu | |
| 7,659,143 B2 | 2/2010 | Tang et al. | |
| 7,777,351 B1* | 8/2010 | Berry et al. | 257/778 |
| 7,851,894 B1* | 12/2010 | Scanlan | 257/659 |
| 7,851,905 B2 | 12/2010 | Chrysler et al. | |
| 8,064,224 B2 | 11/2011 | Mahajan et al. | |
| 8,093,704 B2 | 1/2012 | Palmer et al. | |
| 8,227,904 B2 | 7/2012 | Braunisch et al. | |
| 8,319,338 B1* | 11/2012 | Berry et al. | 257/738 |
| 8,482,111 B2* | 7/2013 | Haba | 257/686 |
| 8,823,158 B2* | 9/2014 | Oh et al. | 257/686 |
| 8,883,563 B1* | 11/2014 | Haba et al. | 438/112 |
| 8,912,670 B2 | 12/2014 | Teh et al. | |
| 2002/0070443 A1 | 6/2002 | Mu et al. | |
| 2003/0144405 A1 | 7/2003 | Lewin et al. | |
| 2003/0222344 A1 | 12/2003 | Hosoyamada et al. | |
| 2005/0067688 A1* | 3/2005 | Humpston | 257/704 |
| 2005/0098891 A1 | 5/2005 | Wakabayashi et al. | |
| 2005/0230835 A1 | 10/2005 | Sunohara et al. | |
| 2006/0046468 A1* | 3/2006 | Akram et al. | 438/637 |
| 2006/0087036 A1 | 4/2006 | Yang | |
| 2006/0097379 A1 | 5/2006 | Wang | |
| 2006/0226527 A1 | 10/2006 | Hatano et al. | |
| 2007/0138644 A1* | 6/2007 | McWilliams et al. | 257/774 |
| 2007/0148819 A1* | 6/2007 | Haba et al. | 438/107 |
| 2007/0205496 A1* | 9/2007 | Haba et al. | 257/686 |
| 2008/0054448 A1 | 3/2008 | Lu et al. | |
| 2008/0315398 A1 | 12/2008 | Lo et al. | |
| 2009/0045524 A1* | 2/2009 | Mohammed et al. | 257/777 |
| 2010/0072598 A1* | 3/2010 | Oh et al. | 257/686 |
| 2011/0210443 A1* | 9/2011 | Hart et al. | 257/738 |
| 2011/0233764 A1 | 9/2011 | Chang et al. | |
| 2012/0161331 A1 | 6/2012 | Gonzalez et al. | |
| 2013/0249116 A1* | 9/2013 | Mohammed et al. | 257/777 |
| 2014/0091445 A1 | 4/2014 | Teh et al. | |
| 2014/0091474 A1 | 4/2014 | Starkston et al. | |
| 2014/0332946 A1* | 11/2014 | Oh et al. | 257/686 |
| 2015/0084210 A1 | 3/2015 | Chiu et al. | |
| 2015/0104907 A1 | 4/2015 | Teh et al. | |

FOREIGN PATENT DOCUMENTS

| | | |
|---|---|---|
| DE | 112013000494 T5 | 10/2014 |
| KR | 20110123297 A | 11/2011 |
| KR | 20120014099 A | 2/2012 |
| KR | 20130007049 A | 1/2013 |
| WO | WO-0215266 A2 | 2/2002 |
| WO | WO-2014051714 A1 | 4/2014 |

OTHER PUBLICATIONS

International Application Serial No. PCT/US2013/044001, International Search Report mailed Aug. 27, 2013, 3 pgs.

International Application Serial No. PCT/US2013/044001, Written Opinion mailed Aug. 27, 2013, 6 pgs.

Braunisch, Henning, et al., "High-speed performance of Silicon Bridge die-to-die interconnects", Electrical Performance of Electronic Packaging and Systems (EPEPS), IEEE 20th Conference, (Oct. 23, 2011), 95-98.

Kumagai, K, et al., "A silicon interposer BGA package with Cu-filled TSV and multi-layer Cu-plating interconnect", Proc. IEEE Electronic Components and Technol. Conf. (ECTC), Lake Buena Vista, FL, (May 27-30, 2008), 571-576.

Sunohara, M, et al., "Silicon Interposer with TSVs (through silicon vias) and fine multilayer wiring", Proc. IEEE Electronic Components and Technol. Conf. (ECTC), (May 27-30, 2008), 847-852.

Towle, Steven N., et al., "Bumpless Build-Up Layer Packaging", (2001), 7 pgs.

U.S. Appl. No. 13/630,297, Response filed Nov. 12, 2014 to Restriction Requirement mailed Sep. 12, 2014, 9 pgs.

U.S. Appl. No. 13/630,297, Restriction Requirement mailed Sep. 12, 2014, 7 pgs.

U.S. Appl. No. 13/631,205, Notice of Allowance mailed Aug. 1, 2014, 11 pgs.

U.S. Appl. No. 13/631,205, Response filed Jun. 30, 2014 to Restriction Requirement mailed Apr. 29, 2014, 6 pgs.

U.S. Appl. No. 13/631,205, Restriction Requirement mailed Apr. 29, 2014, 6 pgs.

Germany Application Serial No. 102014003462.3, Office Action mailed Dec. 3, 2014, 19 pgs.

U.S. Appl. No. 13/630,297, Non Final Office Action mailed Mar. 3, 2015, 11 pgs.

U.S. Appl. No. 13/630,297, Notice of Allowance mailed May 8, 2015, 8 pgs.

U.S. Appl. No. 13/630,297, Response filed Apr. 22, 2015 to Non Final Office Action mailed Mar. 3, 2015, 9 pgs.

U.S. Appl. No. 14/036,719, Restriction Requirement mailed May 7, 2015, 5 pgs.

U.S. Appl. No. 14/570,785, Non Final Office Action mailed Feb. 26, 2015, 7 pgs.

U.S. Appl. No. 14/570,785, Response May 14, 2015 to Non Final Office Action mailed Feb. 26, 2015, 5 pgs.

International Application Serial No. PCT/US2013/044001, International Preliminary Report on Patentability mailed Apr. 9, 2015, 8 pgs.

"Germany Application Serial No. 102014003462.3, Response filed Apr. 8, 2015 Office Action mailed Dec. 3, 2014", W/ English Claims, 22 pgs.

"Korean Application Serial No. 2014-0030620, Office Action mailed by May 7, 2015", W/ English Translation, 9 pgs.

U.S. Appl. No. 14/570,785, filed Dec. 15, 2014, Bumpless Build-Up Layer Package Including an Integrated Heat Spreader.

"U.S. Appl. No. 14/570,785, Notice of Allowance mailed May 28, 2015", 8 pgs.

* cited by examiner

TALL SOLDERS FOR THROUGH-MOLD INTERCONNECT

TECHNICAL FIELD

Examples generally relate to the packaging of integrated circuits, and more specifically to tall solders for a through-mold interconnect (TMI).

TECHNICAL BACKGROUND

Miniaturization efforts can lead to circuits being crowded into smaller geometries. Performance and miniaturization efforts can benefit from mounting packages onto a chip, for example. Packages can even be mounted onto other packages. However, interconnecting such packages can be difficult. Also, as this kind of complexity is added, yield can be affected, which should be compensated for.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DESCRIPTION OF EMBODIMENTS

Examples in this disclosure relate to apparatuses and systems that include a taller solder than current through mold interconnect techniques. Examples also relate to techniques of creating taller solder contacts for through mold interconnects.

The following description includes terms, such as upper, lower, first, second, etc. that are used for descriptive purposes only and are not to be construed as limiting. The examples of an apparatus or article described herein can be manufactured, used, or shipped in a number of positions and orientations. The terms "die" and "chip" generally refer to the physical object that is the basic workpiece that is transformed by various process operations into the desired integrated circuit device. A die is usually singulated from a wafer and wafers may be made of semiconducting, non-semiconducting, or combinations of semiconducting and non-semiconducting materials.

Miniaturization efforts can lead to circuits being crowded into smaller geometries. Through-Mold-Interconnect (TMI) is widely used to form an electrical connection from the system-on-a-chip (SoC) package to the memory package, which can be mounted on the top of the SoC package.

Top-Side-Ball-Attach (TSBA) ball height target can be determined by the surface mount technology process to ensure successful package-on-package (PoP) assembly. The current surface mount technology process indicates the hole depth of 75 um is required to accommodate the package warpage. Based on the estimated die thickness and overmold height, the required top-side ball attach ball height target can be between about 245 and 285 um for the best and worst cases, respectively. When multiple dies are stacked in the system-on-a-chip package, the required top-side ball attach can be even taller.

The best case top-side ball attach ball height target can barely be met by a "one step Low Temperature Solder (LTS)/Intermediate Temperature Solder (ITS) Paste+Ball" process, while there are currently no known good methods to meet the worst case target. This disclosure proposes a plurality of techniques to form taller solder balls, such as to meet the needs of a worst case target or more reliably meet the best case target.

Reference will now be made to the drawings wherein like structures will be provided with like suffix reference designations. In order to show the structures of various examples clearly, the drawings included herein are diagrammatic representations of integrated circuit structures. Thus, the actual appearance of the fabricated structures, for example in a photomicrograph, may appear different while still incorporating subject matter of the illustrated examples. Moreover, the drawings show the structures to aid in understanding the illustrated examples.

Figure 1:
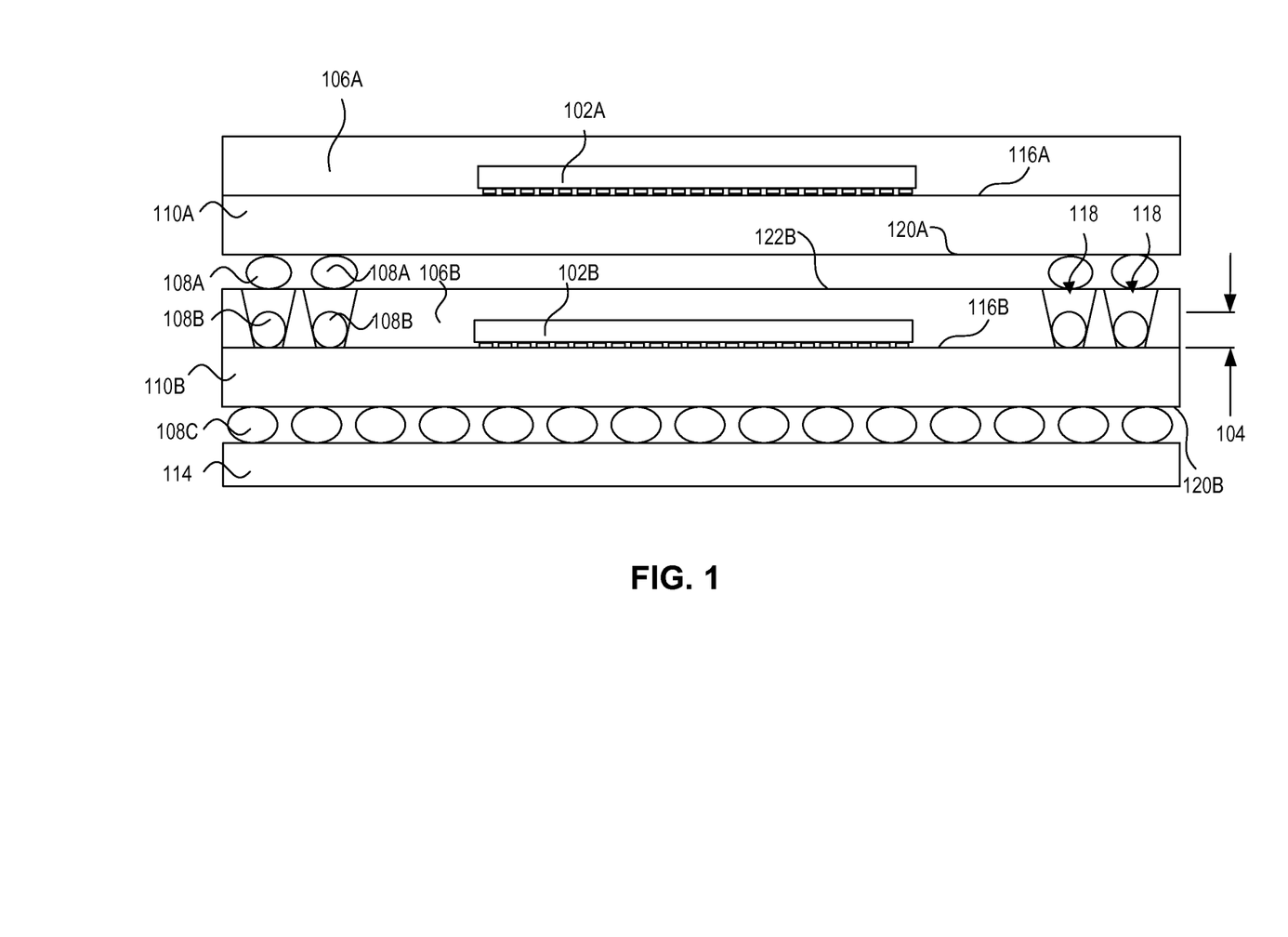
FIG. 1 illustrates an example of a microelectronic die package.

FIG. 1 illustrates a cross-section view of multiple die packages prior to surface mounting the die packages together. The multiple die packages can include a first microelectronic die 102A package (e.g., the first microelectronic die package can include one or more solder balls 108A, molding 106A, substrate 110A, and the die 102A), a second microelectronic die 102B package (e.g., the second microelectronic die package can include one or more solder balls 108B, molding 106B, substrate 110B, die 102B, and one or more solder balls 108C), and a Printed Circuit Board (PCB) 114. The die 102A and the die 102B can be any type of integrated circuit die. The dies 102A and 102B can be a processor, such as a multi-core microprocessor, or a memory. The dies 102A and 102B can be primarily digital logic or a primarily analog logic die. The dies 102A and 102B can comprise a memory device, a processor, other type of die, or a combination thereof. The packages can be constructed as a bump-less build-up layer (BBUL) package.

The package can include a substrate 110A or 110B. The substrate 110A or 110B can include a die 102A or 102B disposed on or over an upper surface 116A or 116B of the substrate 110A or 110B and exposed along an upper surface 116A or 116B of the substrate 110. The substrate 110B can be configured to couple with the PCB 114 along a lower surface 120B of the substrate 110B. The PCB 114 can be coupled to the substrate 110B through a solder ball 108C connection. The second microelectronic die package (e.g., the package including die 102B) can be situated below the lower surface 120A of the first substrate 110A.

The first and second microelectronic die packages can include molding 106A and 106B, respectively. The molding 106A or 106B can be disposed on the substrate 110A and 110B respectively. The molding 106B can include one or more solder balls 108B, situated in a respective opening 118 in the molding 106B. The opening 118 can be laser ablated, or otherwise excised, into the molding 106B. The opening 118 can extend from an upper surface 122B of the molding 106B towards the upper surface 116B of the second substrate 110B. The height 104 of the balls (e.g., solder columns) 108B can be controlled or increased using one or more processes or techniques discussed herein. In one or more embodiments, the height 104 of the balls 108B is between about 220 micrometers and 640 micrometers. In one or more other embodiments, the height of the balls 108B is between about 230 and 320 micrometers. In yet other embodiments, the height of the balls 108B can be between about 240 and 320 micrometers. Using the techniques disclosed herein, the solder balls 108B can be extended to virtually any height. The factors that limit the height 104 are the need to conserve space and the depth of the opening 118. Any depth can be accommodated using the techniques discussed herein. The balls 108 can include solder and can be coupled to the circuit. The balls 108B can be mechanically coupled to the second substrate 110B. The balls 108B can extend above the upper surface 116B of the second substrate 110B to a height 104 sufficient to electrically couple with the solder ball 108A when the solder ball 108A is at least partially situated in the opening 118 and reflowed.

FIGS. 2A-2G illustrate stages of a process for creating solder balls for TMI, according to an example. FIGS. 2A, 3A, 4A, 5A, 6A, and 7A show exploded cross-section views of the second microelectronic die package from the lower surface 120B of the substrate 110B to the upper surface 116B of the substrate 110B with one or more etch stop layers 204 and a contact 206 on that surface 116B, unless described otherwise.

Figure 2A:
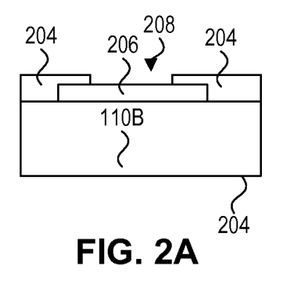
FIGS. 2A-2G illustrate stages of an example of a process for creating solder balls for TMI.
Figure 2B:
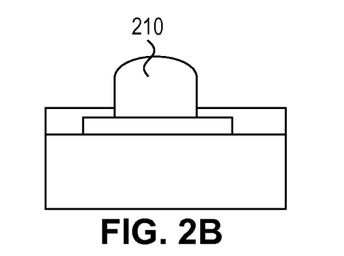
Figure 2C:
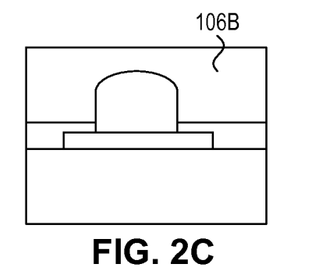
Figure 2D:
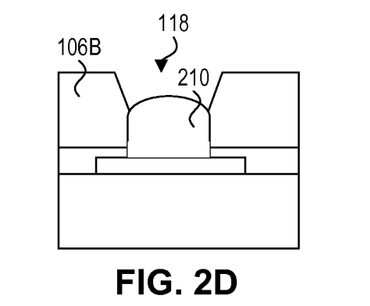

FIGS. 2A-2D illustrate the current state of the art technique for forming TSBA balls. FIG. 2A illustrates a substrate 110B, which can be provided as a panel, can be combined with etch stop layers 204 and a contact 206, such as a Package on Package (PoP) contact. The contact 206 can be made of conductive material, such as copper, gold, or other conductive materials. A solder resist opening 208 can be formed, such as on the contact 206 or between the one or more etch stop layers 204. Examples of etch stop layers 204 include, but are not limited to, a dielectric material, such as a material having a low Young's Modulus, such as an Ajinomoto Build-up Film (ABF) dielectric material, including, but not limited to, GX-92, T-31 and other materials, each optionally combined with one or more fillers. One or more of these materials is manufactured by Ajinomoto Fine-Techno Co., Inc. FIG. 2B shows the elements of FIG. 2A with a TSBA ball 210 on the contact 206. In one or more embodiments, the TSBA ball 210 can be a maximum of 220 micrometers in height 104. The TSBA ball can be created using a reflow process. FIG. 2C shows an assembly after the package 200 is molded to include molding 106B. FIG. 2D shows the package of FIG. 2C with an opening 118 in the molding 106B that extends to the TSBA ball 210. This process limits the TSBA ball 210 height to at most 220 micrometers due to constraints on the solder ball size and the risk of creating bridging between balls (e.g., the multiple balls 108B shown in FIG. 1) due to the risk of solder overflowing the opening 118. A technique that more precisely controls the height of the solder balls 108B would be beneficial to allow the height of the solder balls 108B to increase without increasing the risk of bridging between balls 108B.

Figure 2E:
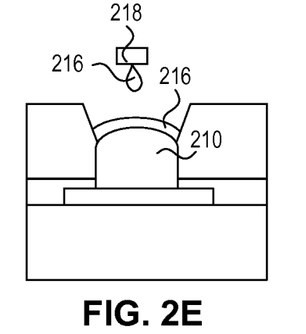
Figure 2F:
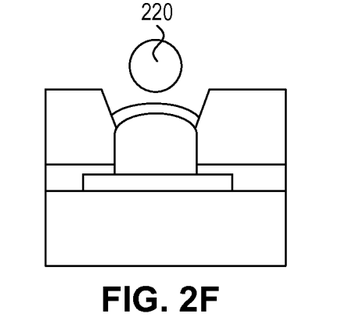
Figure 2G:
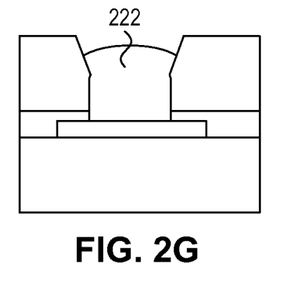

At FIG. 2E a thin (e.g., a few microns thick) flux layer 216 can be deposited on the TSBA ball 210. In one or more embodiments, the thin flux layer 216 can be deposited using an inkjet printer 218, such as a dispensing device from Micro-Fab Technologies, Inc. of Plano, Tex. Other inkjet printer 218 manufacturers or product lines include Hewlett Packard, MicroDrop, XENNiA, Diamatix, and SIJ Technology. A solder ball 220 can be deposited on the flux and reflowed, such as to extend the height of the TSBA ball 210. Using such a process can help control or extend the height of a TSBA ball 210, thus increasing the likelihood of contacting the TSBA ball 210 when a part is to be coupled to the TSBA ball 210. FIG. 2G shows the resulting package after the reflow, including the extended TSBA ball 222 (e.g., solder column) created using the process.

Figure 3A:
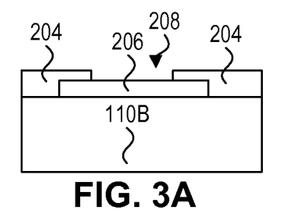
FIGS. 3A-3G illustrate stages of another example of a process for creating solder balls for TMI.
Figure 3B:
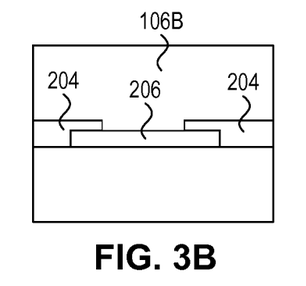
Figure 3C:
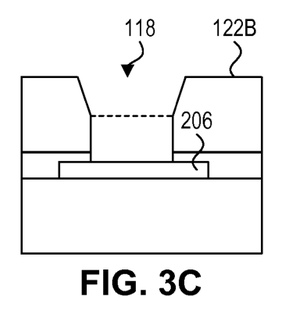

FIGS. 3A-3G illustrate stages of another process for creating solder balls for TMI. The process starts with the package depicted in FIG. 3A, which is substantially the same package configuration as the package in FIG. 2A. The package can be molded to include molding 106B on the contact 206 and etch stop layers 204, such as shown in FIG. 3B. The molding 106B can be laser ablated to include an opening 118 therein, such as shown in FIG. 3C. The opening 118 can extend from a top surface 122B of the molding 106B to the contact 206. The opening 118 can include a substantially cylindrical portion and a substantially frustoconical portion. The cylindrical portion is depicted below the dotted line and the frustoconical portion is depicted above the dotted line in FIG. 3C.

Figure 3D:
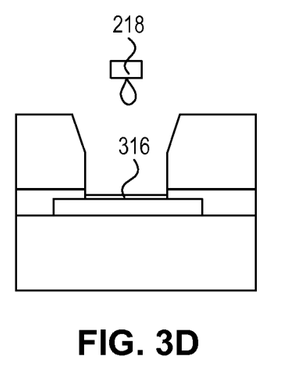
Figure 3E:
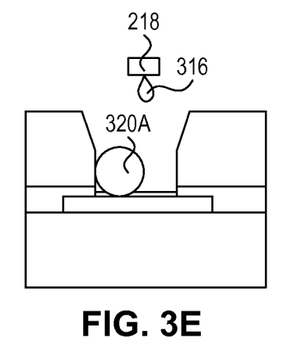
Figure 3F:
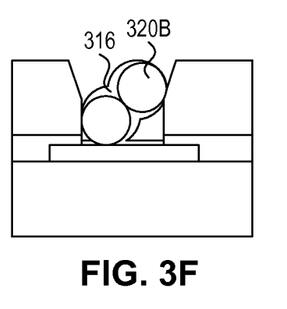
Figure 3G:
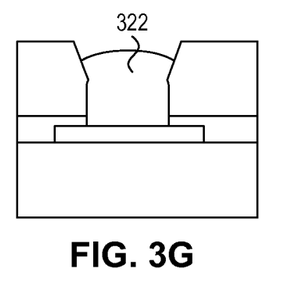

FIG. 3D shows a thin layer of flux 316 deposited on the contact 206. The flux 316 layer can be deposited, such as by using the inkjet printer 218, such as shown in FIG. 3D. A solder ball 320A can be situated on the flux 316 and in the opening 118, such as shown in FIG. 3E. Flux 316, can be deposited on the solder ball 320A, as is also shown in FIG. 3E. Another solder ball 320B, can be deposited on the solder ball 320B, such as shown in FIG. 3F. FIG. 3G shows the package of FIG. 3F after the package is reflowed. Such a package can include an extended TSBA ball 322.

Figure 4A:
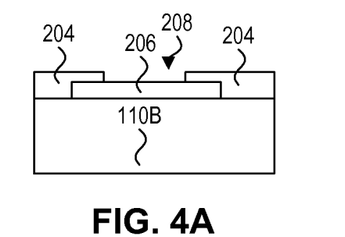
FIGS. 4A-4F illustrate stages of another example of a process for creating solder balls for TMI.
Figure 4B:
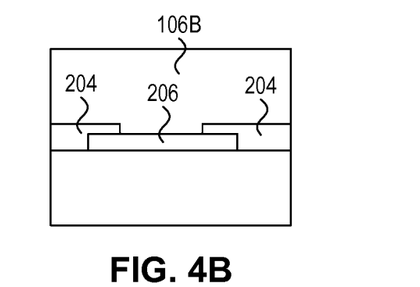
Figure 4C:
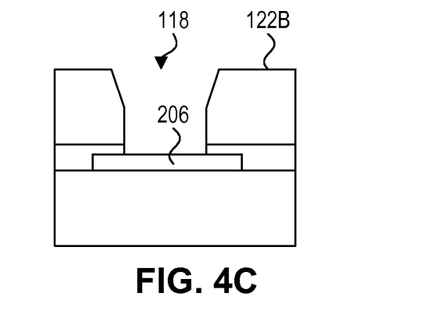
Figure 4D:
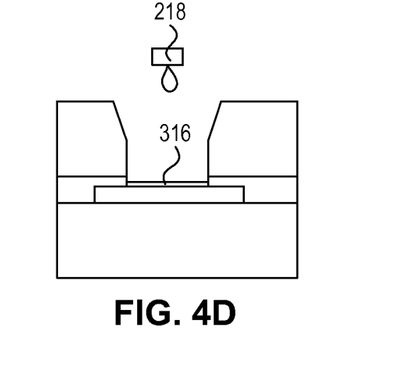

FIGS. 4A-4F illustrate stages of another process for creating solder balls for TMI. FIGS. 4A-4D depict essentially the same process as described with regard to FIGS. 3A-3D. The process depicted in FIG. 4A starts with the same package configuration as the package in FIG. 2A. The package can be molded to include molding 106B on the contact 206 and etch stop layers 204, such as shown in FIG. 4B. The molding 106B can be laser ablated to include an opening 118 therein, such as shown in FIG. 4C. The opening 118 can extend from a top surface 122B of the molding 106B to the contact 206. FIG. 4D shows a thin layer of flux 316 deposited on the contact 206. The flux 316 layer can be deposited, such as by using the inkjet printer 218.

Figure 4E:
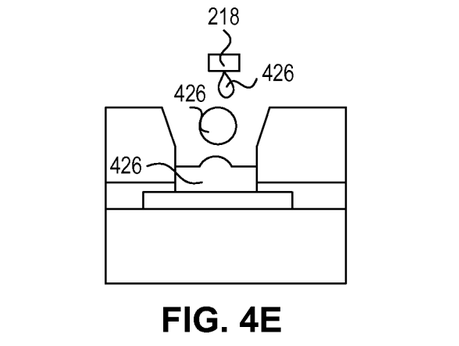
Figure 4F:
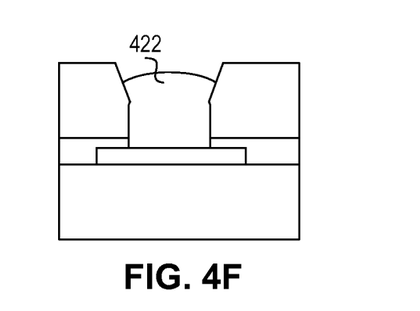

At FIG. 4E molten solder spheres 426 can be deposited, such as by inkjet printing using inkjet printer 218, into the opening 118 and onto the flux 316, such as to at least partially fill the opening 118. FIG. 4F shows the package after an extended TSBA ball 422 has been formed in the opening 118 by depositing the molten solder spheres 426 into the opening 118.

Figure 5A:
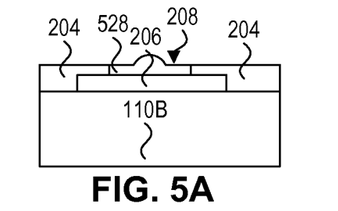
FIGS. 5A-5F illustrate stages of another example of a process for creating solder balls for TMI.
Figure 5B:
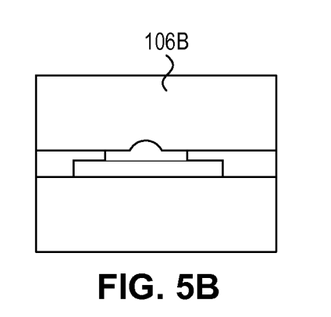
Figure 5C:
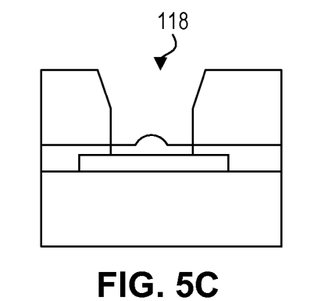
Figure 5D:
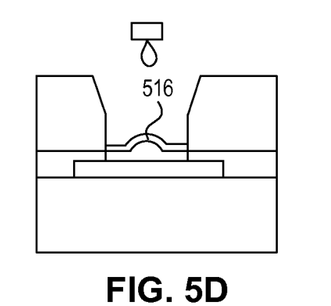
Figure 5E:
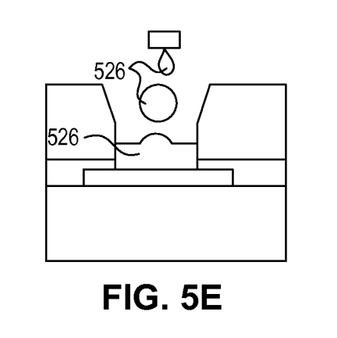
Figure 5F:
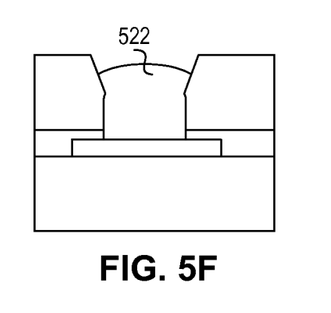

FIGS. 5A-5F illustrate stages of another process for creating solder balls for TMI. FIG. 5A depicts a package substantially similar to that shown in FIGS. 2A, 3A, and 4A, with the solder resist opening 208 filled with solder 528. The solder 528 can be substantially flush with the top surface of the etch stop layers 204. At FIG. 5B the package of FIG. 5A can be molded to include molding 106B on the etch stop layers 204 and the solder 528. FIG. 5C depicts an opening 118 formed in the molding 106B. A layer of flux 516 can be inkjet printed on the solder 528, such as shown in FIG. 5D. FIG. 5E depicts molten solder 526 being deposited on the solder 528. FIG. 5F depicts a resulting package after the molten solder 526 is deposited to form an extended TSBA ball 522.

Figure 6A:
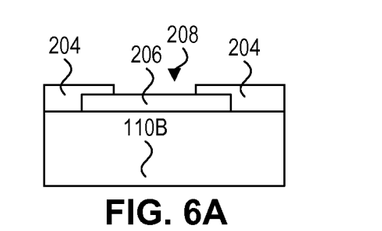
FIGS. 6A-6E illustrate stages of another example of a process for creating solder balls for TMI.
Figure 6B:
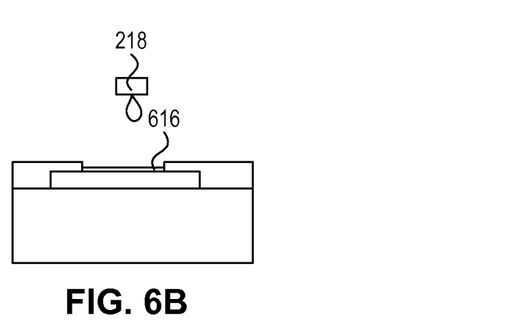
Figure 6C:
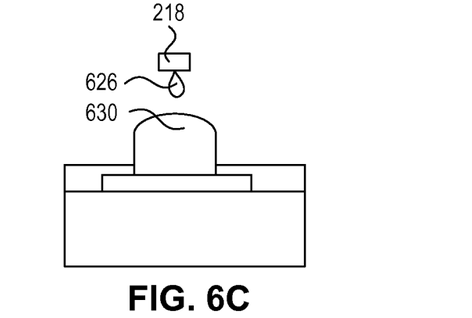
Figure 6D:
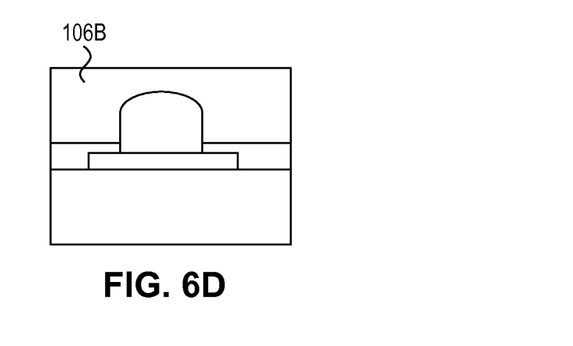
Figure 6E:
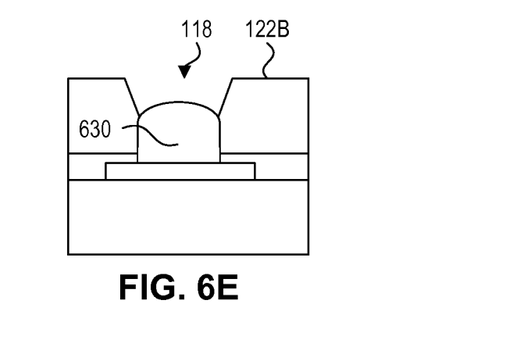

FIGS. 6A-6E illustrate stages of another process for creating solder balls for TMI. FIG. 6A depicts a package substantially similar to the packages depicted in FIGS. 2A and 3A. A layer of flux 616 can be situated on the contact 206, such as shown in FIG. 6B. The layer of flux 616 can be deposited using an inkjet printer 218. Molten solder balls 626 can be inkjet printed so as to form a solder column 630, such as shown in FIG. 6C. The solder column 630 can be formed to a desired height, such as a height capable of handling a worst case scenario TMI process (e.g., about 285 um). The package of FIG. 6C can be molded to include molding 106B. The molding 106B can be laser ablated, mechanically drilled, chemically etched, or otherwise modified to include opening 118. The opening 118 can extend from the top surface 122B of the molding 106B to the solder column 630, such as shown in FIG. 6E. The opening 118 can be configured to allow an electrical coupling to the solder column 630 to be made. The opening 118 can be configured to at least partially admit the solder ball 108A and put the solder ball 108A in close enough proximity to solder ball 108B so as to allow the two solder balls 108A and 108B to be reflowed to form a reliable electrical connection.

Figure 7A:
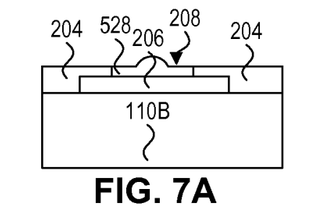
FIGS. 7A-7F illustrate stages of another example of a process for creating solder balls for TMI.
Figure 7B:
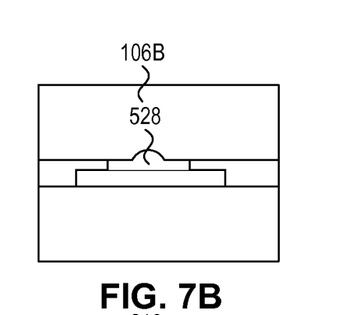
Figure 7C:
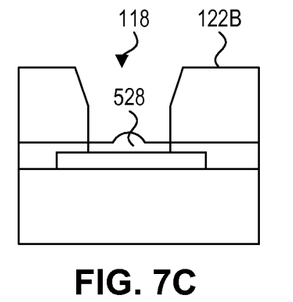
Figure 7D:
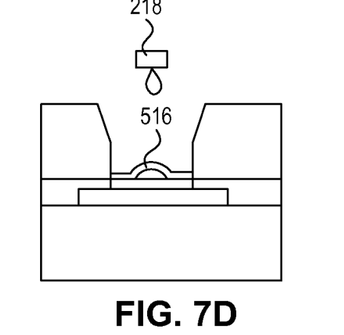
Figure 7E:
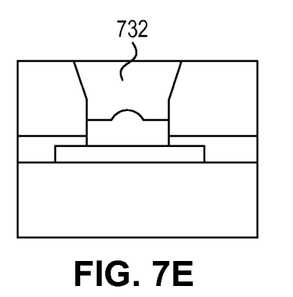
Figure 7F:
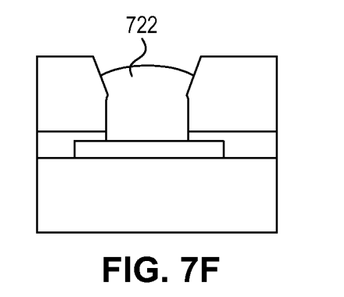

FIGS. 7A-7F illustrate stages of another process for creating solder balls for TMI. FIG. 7A depicts a package substantially similar to the package shown in FIG. 5A. The package of FIG. 7A can be molded so as to situate molding 106B on the etch stop layers 204 and the solder 528, such as shown in FIG. 7B. An opening 118 can be laser ablated into the molding 106B. The opening 118 can extend from a top surface 122B of the molding 106B to the solder 528, such as shown in FIG. 7C. FIG. 7D illustrates the package of FIG. 7C with a layer of flux 516 inkjet printed on the solder 528. The opening 118 can be filled, at least partially, with solder paste 732 and the package can be reflowed, as shown in FIGS. 7E and 7F, respectively. FIG. 7F depicts the resulting package, including an extended TSBA ball 722 (e.g., an extended TSBA ball is also called a solder column herein) formed in the opening 118.

Figure 8:
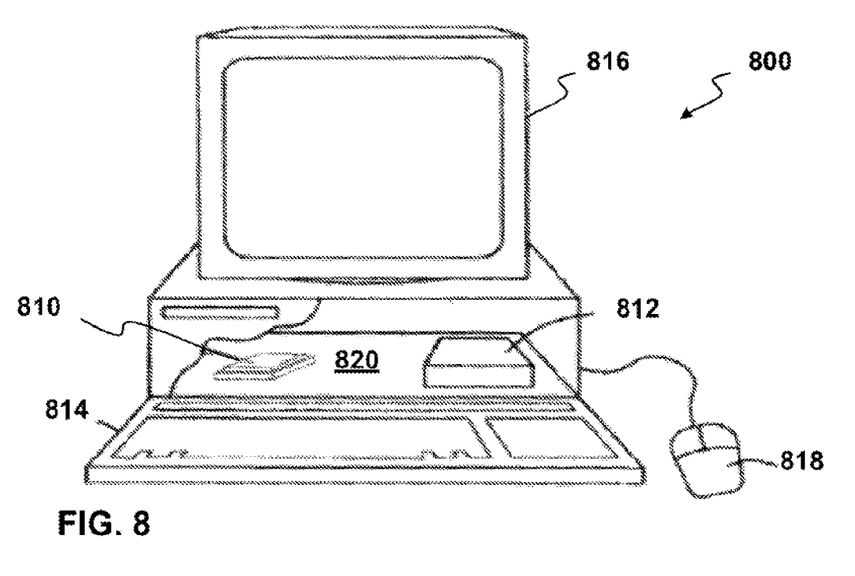
FIG. 8 is a cut-away elevation that depicts an example of a computing system.

FIG. 8 depicts a computing system 800 according to an example. One or more of the foregoing examples of packages that include an extended TSBA ball, such as those manufactured according to a foregoing process, may be utilized in a computing system, such as computing system 800 of FIG. 8. A component (e.g., a package, die, device, etc.) with an extended TSBA ball manufactured according to a method or technique alone or in combination with any other embodiment can be referred to as an example(s) configuration.

The computing system 800 can include processor, which can be enclosed in an IC chip package 810, a data storage system 812, input device such as a keyboard 814, and output device such as a monitor 816. The computing system 800 can include a processor that processes data signals and may include, for example, a microprocessor available from Intel Corporation. In addition to the keyboard 814, the computing system 800 can include another user input device such as a mouse 818.

The computing system 800 embodying components in accordance with the claimed subject matter can include any system that utilizes a microelectronic device system, which may include, for example, the integrated heat spreader assemblies described above, such as those manufactured according to a method example, which can be coupled to data storage such as dynamic random access memory (DRAM), polymer memory, flash memory, and phase-change memory. Certain example(s) can be coupled to any combination of these by being coupled to a processor. Data storage can include an embedded DRAM cache on a die. Example(s) configuration coupled to the processor can be part of a system with an example(s) configuration coupled to the data storage of the DRAM cache. Example(s) configuration can be coupled to the data storage system 812.

In an example, the computing system 800 can also include a die that contains a digital signal processor (DSP), a micro controller, an application specific integrated circuit (ASIC), or a microprocessor. An example(s) configuration can be coupled to any combination of these by being coupled to a processor. For an example, a DSP can be part of a chipset that can include a stand-alone processor and the DSP as separate parts of the chipset on a board 820. An example(s) configuration can be coupled to the DSP and a separate example(s) configuration may be present that can be coupled to the processor in the IC chip package 810. Additionally in an example, an example(s) configuration can be coupled to a DSP that can be mounted on the same board 820 as the IC chip package 810. An example(s) configuration can be combined as set forth with respect to the computing system 800, in combination with an example(s) configuration as set forth by the various examples of the integrated heat spreader assemblies manufactured according to a method example within this disclosure and their equivalents.

Examples set forth in this disclosure can be applied to devices and apparatuses other than a traditional computer. For example, a die can be packaged with an example(s) configuration and placed in a portable device such as a wireless communicator or a hand-held device such as a smart phone, a personal data assistant and the like. Another example can be a die that can be packaged with an example(s) configuration and placed in a vehicle such as an automobile, a locomotive, a watercraft, an aircraft, or a spacecraft.

Figure 9:
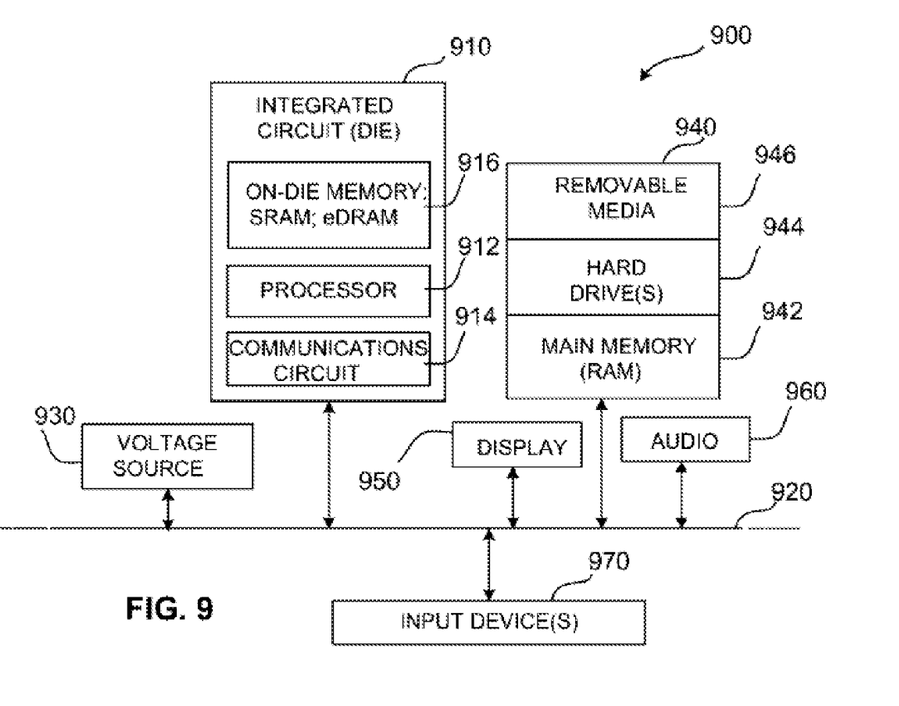
FIG. 9 is a schematic of an example of an electronic system.

FIG. 9 is a schematic of an electronic system 900 according to an example. The electronic system 900 as depicted can embody the computing system 800 depicted in FIG. 8, with the electronic system can be depicted schematically. The electronic system 900 incorporates electronic assembly 910, such as an IC die illustrated above. In an example, the electronic system 900 can be a computer system that can include a system bus 920 to electrically couple the various components of the electronic system 900. The system bus 920 can be a single bus or any combination of busses according to various examples. The electronic system 900 can include a voltage source 930 that provides power to the integrated circuit 910. In some examples, the voltage source 930 supplies current to the integrated circuit 910 through the system bus 920.

The integrated circuit 910 can be electrically coupled to the system bus 920 and includes any circuit or combination of circuits according to an example. In an example, the integrated circuit 910 includes a processor 912 that can be of any type. As used herein, the processor 912 means any type of circuit such as, but not limited to, a microprocessor, a microcontroller, a graphics processor, a digital signal processor, or another processor. Accordingly, an integrated heat spreader assembly can be part of the electronic system that seats two dice, such as a processor first die and a second die selected from a processor or another die that is part of a chipset. Other types of circuits that can be included in the integrated circuit 910 are a custom circuit or an ASIC, such as a communications circuit 914 for use in wireless devices such as cellular telephones, pagers, portable computers, two-way radios, and similar electronic systems. In an example, the integrated circuit 910 includes on-die memory 916 such as static random-access memory (SRAM). In an example, the integrated circuit 910 includes on-die memory 916 such as embedded dynamic random-access memory (eDRAM).

In an example, the electronic system 900 also includes an external memory 940 that in turn may include one or more memory elements suitable to the particular application, such as a main memory 942 in the form of RAM, one or more hard drives 944, and/or one or more drives that handle removable media 946, such as diskettes, compact disks (CDs), digital video disks (DVDs), flash memory keys, and other removable media known in the art.

In an example, the electronic system 900 also includes a display device 950 and an audio output 960. In an example, the electronic system 900 includes an input 970, such as a keyboard, mouse, trackball, game controller, microphone, voice-recognition device, or any other device that inputs information into the electronic system 900.

As shown herein, integrated circuit 910 can be implemented in a number of different examples, including an electronic package, an electronic system, a computer system, one or more methods of fabricating an integrated circuit, and one or more methods of fabricating an electronic assembly that includes the integrated heat spreader assemblies as set forth herein in the various examples and their art-recognized equivalents. The elements, materials, geometries, dimensions, and sequence of operations can all be varied to suit particular packaging requirements.

Figure 10:
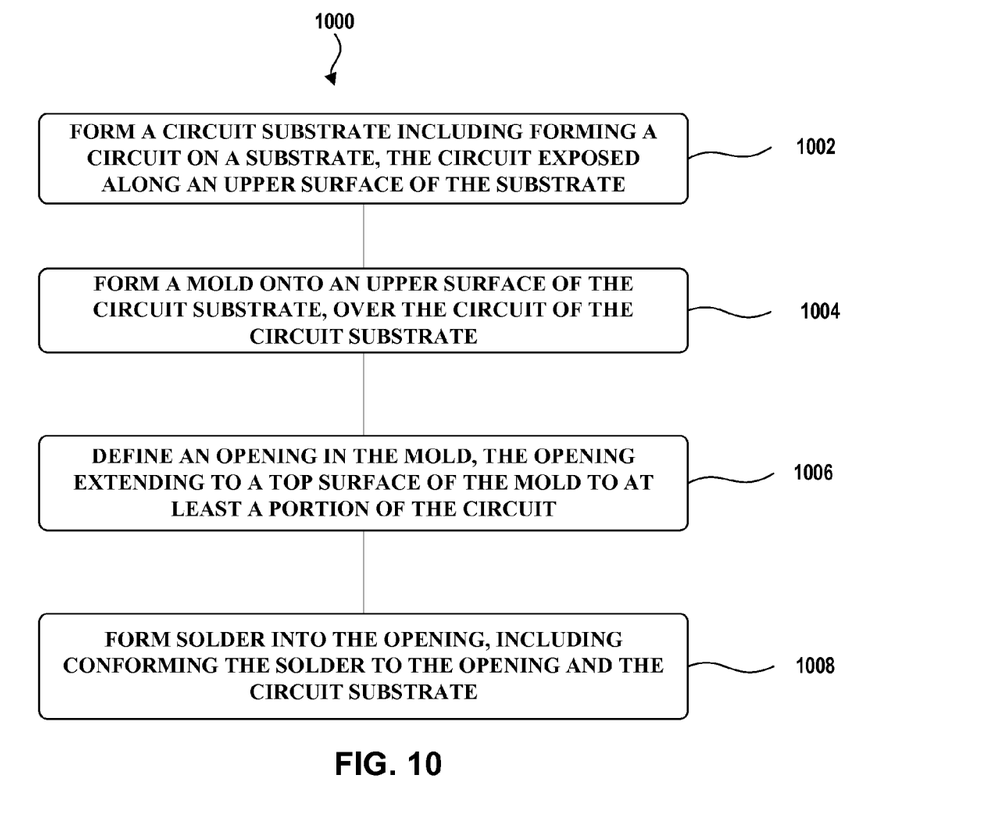
FIG. 10 is a flowchart showing an example of a technique of making a packaged die with an integrated heat spreader.

FIG. 10 is a flowchart showing a technique 1000 for creating a package including one or more solder balls for TMI. The technique 1000 can include, at 1002, forming a circuit substrate including forming a circuit on a substrate 110, the circuit exposed along an upper surface 116 of the substrate 110, wherein the substrate 110 is configured for coupling the circuit with the second die 102B (e.g., integrated circuit) above an upper surface 116B of the circuit substrate (e.g., substrate 110B, contact 206, etch-stop layers 204, other components and connections used to couple the substrate 110B to the second die 102B or the PCB 114, or a combination thereof). At 1004, a mold 106 can be formed onto an upper surface 116 of the circuit substrate and over the circuit of the circuit substrate. At 1006, an opening 118 can be defined in the mold 106, the opening 118 can extend to a top surface 116 of the molding 106 to at least a portion of the circuit. At 1008, solder (e.g., ball 108) can be formed into the opening 118, including conforming the solder to the opening 118 and the circuit substrate. Forming solder can include forming a first solder portion (e.g., solder 528) onto the circuit substrate before molding, and forming a second solder portion into the opening 118 after molding (see FIGS. 2A-2G, for example). Adding the second solder portion can include melting a solder ball 220 in the opening 118. The circuit substrate can include a solder-resistant mask (e.g., etch stop layer 204). The first solder portion can, at least partially, fill the opening 118. The solder portion can be printed to extend above the solder-resistant mask. The solder portion can be printed to be substantially flush with the solder-resistant mask, such as shown in FIGS. 5A and 7A. Forming the solder can include inkjet printing or reflowing solder into the opening 118. In one or more embodiments, solder paste 732 can be deposited in the opening 118 and reflowed to form a TSBA ball 722, such as shown in FIGS. 7E and 7F. Forming solder can include inkjet printing the solder into the opening 118 and melting at least one solder ball into the opening, such as shown in FIG. 5E and FIG. 3F. Forming solder can include printing the solder onto the circuit substrate. Defining the opening 118 can include excising (e.g., laser ablating) the molding 106 to define the opening.

EXAMPLES AND NOTES

The present subject matter may be described by way of several examples.

Example 1 can include subject matter (such as a system, apparatus, method, tangible machine readable medium, etc.) that can include a multi-chip electronic package. The example can include a first microelectronic chip package including a first die situated on an upper surface of a first substrate and a solder ball situated on a lower surface of the first substrate. The example can include a second microelectronic chip package situated below the lower surface of the first substrate. The second microelectronic package can include a second die situated on a top surface of a second substrate. The second microelectronic package can include a molding disposed over the upper surface of the second substrate, the molding extending over the circuit and including an opening extending from an upper surface of the molding towards an upper surface of the second substrate, wherein the opening is configured to admit at least a portion of the solder ball. The second microelectronic package can include a solder column mechanically coupled to the second substrate, situated in the opening, and extending above the upper surface of the second substrate to a height sufficient to electrically couple with the solder ball when the solder ball is at least partially situated in the opening and reflowed.

Example 2 can include any of the preceding examples, wherein the height of the solder column is between about 220 and 320 micrometers.

Example 3 can include any of the preceding examples, wherein the opening is one of a plurality of openings disposed in the molding at a pitch of less than 400 micrometers.

Example 4 can include any of the preceding examples, wherein the opening is an ablation in the molding.

Example 5 can include any of the preceding examples, wherein the opening defines a cylindrical portion extending down to the upper surface of the second substrate and a frustoconical portion coextensive with the cylinder, opening away from the cylinder, and extending to an upper surface of the molding, with the solder column conforming to the cylinder.

Example 6 can include any of the preceding examples, wherein the solder column conforms to the cylindrical portion and at least a portion of the frustoconical portion.

Example 7 can include any of the preceding examples, wherein the second microelectronic package includes a solder resistant mask disposed over the second substrate and defining a mask opening, with the opening of the molding extending to the mask opening.

Example 8 can include any of the preceding examples, wherein the opening in the molding and the mask opening are coextensive.

Example 9 can include any of the preceding examples, A method of forming a microelectronic package, comprising:

forming a circuit substrate including forming a circuit on a substrate, the circuit exposed along an upper surface of the substrate, wherein the substrate is for coupling the circuit with a die above an upper surface of the circuit substrate. The example can include forming a mold onto an upper surface of the circuit substrate, over the circuit of the circuit substrate. The example can include defining an opening in the mold, the opening extending to a top surface of the mold to at least a portion of the circuit. The example can include forming solder into the opening, including conforming the solder to the opening and the circuit substrate.

Example 10 can include any of the preceding examples, wherein forming solder includes forming a first solder portion onto the circuit substrate before molding, and forming a second solder portion into the opening after molding.

Example 11 can include any of the preceding examples, wherein adding the second solder portion includes melting a solder ball in the opening.

Example 12 can include any of the preceding examples, wherein the circuit substrate includes a solder-resistant mask, and the first solder portion fills an opening in the solder-resistant mask and is printed to extend above the solder-resistant mask.

Example 13 can include any of the preceding examples, wherein the circuit substrate includes a solder-resistant mask, and the first solder portion fills an opening in the solder-resistant mask and is substantially flush with the solder-resistant mask.

Example 14 can include any of the preceding examples, wherein forming the solder includes at least one of printing and reflowing solder into the opening.

Example 15 can include any of the preceding examples, wherein forming solder includes at least one of printing the solder into the opening and melting at least one solder ball into the opening.

Example 16 can include any of the preceding examples, wherein forming solder includes printing the solder onto the circuit substrate and defining the opening includes excising the molding to define the opening.

Example 17 can include a system that includes a first microelectronic chip package including a first die situated on an upper surface of a first substrate and a solder ball situated on a lower surface of the first substrate. The example can include a second microelectronic chip package situated below the lower surface of the first substrate. The second microelectronic package can include a second die situated on a top surface of a second substrate. The second microelectronic package can include a molding disposed over the upper surface of the second substrate, the molding extending over the circuit and including an opening extending from an upper surface of the molding towards an upper surface of the second substrate, wherein the opening is configured to admit at least a portion of the solder ball. The second microelectronic package can include a solder column mechanically coupled to the second substrate, situated in the opening, and extending above the upper surface of the second substrate to a height sufficient to electrically couple with the solder ball when the solder ball is at least partially situated in the opening and reflowed. The example can include a printed circuit board situated below the second substrate and electrically and mechanically coupled to a second solder ball on the lower surface of the second substrate.

Example 18 can include any of the preceding examples, wherein the solder column is between 220 and 320 micrometers in height.

Example 19 can include any of the preceding examples, wherein the integrated circuit is selected from a data storage device, a digital signal processor, a micro controller, an application specific integrated circuit, and a processor.

Example 20 can include any of the preceding examples, wherein the system is disposed in one of a computer, a wireless communicator, a hand-held device, an automobile, a locomotive, an aircraft, a watercraft, and a spacecraft.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the techniques, apparatuses, and systems can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A multi-chip electronic package, comprising:
   a first microelectronic chip package including a first die situated on an upper surface of a first substrate and a solder ball situated on a lower surface of the first substrate;
   a second microelectronic chip package situated below the lower surface of the first substrate, the second microelectronic package including:
      a second die situated on a top surface of a second substrate,
      a molding disposed over the upper surface of the second substrate, the molding extending over the second die and including an opening extending from an upper surface of the molding towards an upper surface of the second substrate, wherein the opening is configured to admit at least a portion of the solder ball and wherein the opening defines a cylindrical portion extending down to the upper surface of the second substrate and a frustoconical portion coextensive with the cylinder, opening away from the cylinder and extending to the upper surface of the molding, a solder column electrically and mechanically coupled to the second substrate, situated in the opening, conforming to the cylinder, and extending above the upper surface of the second substrate to a height sufficient to electrically couple with the solder ball when the solder ball is at least partially situated in the opening and reflowed, wherein the solder column conforms to the cylindrical portion and to at least a portion of the frustoconical portion, and wherein the solder column includes at least two layers of solder with flux therebetween, a first layer of solder of the at least two layers of solder conforming to the cylindrical portion of the opening and a second layer of solder of the at least two layers of solder conforming to the frustoconical portion of the opening.

2. The multi-chip electronic package of claim 1, wherein the height of the solder column is between 300 and 320 micrometers.

3. The multi-chip electronic package of claim 1, wherein the opening is one of a plurality of openings disposed in the molding at a pitch of less than 400 micrometers.

4. The multi-chip electronic package of claim 1, wherein the opening is an ablation in the molding.

5. The multi-chip electronic package of claim 1, wherein the second substrate includes a solder resistant mask disposed over the upper surface thereof and defining a mask opening, and wherein the opening extends to the mask opening.

6. The multi-chip electronic package of claim 5, wherein the opening in the molding and the mask opening are coextensive.

7. A system, comprising:
a first microelectronic chip package including a first die situated on an upper surface of a first substrate and a solder ball situated on a lower surface of the first substrate;
a second microelectronic chip package situated below the lower surface of the first substrate, the second microelectronic package including:
a second die situated on a top surface of a second substrate,
a molding disposed over the upper surface of the second substrate, the molding extending over the circuit and including an opening extending from an upper surface of the molding towards an upper surface of the second substrate, wherein the opening is configured to admit at least a portion of the solder ball and wherein the opening defines a cylindrical portion extending down to the upper surface of the second substrate and a frustoconical portion coextensive with the cylinder, opening away from the cylinder and extending to the upper surface of the molding, and
a solder column mechanically coupled to the second substrate, situated in the opening, conforming to the cylinder, and extending above the upper surface of the second substrate to a height sufficient to electrically couple with the solder ball when the solder ball is at least partially situated in the opening and reflowed, wherein the solder column conforms to the cylindrical portion and to at least a portion of the frustoconical portion, wherein the solder column includes at least two layers of solder with flux therebetween, a first layer of solder of the at least two layers of solder conforming to the cylindrical portion of the opening and a second layer of solder of the at least two layers of solder conforming to the frustoconical portion of the opening; and
a printed circuit board electrically and mechanically coupled to a second solder ball on the lower surface of the second substrate.

8. The system of claim 7, wherein the solder column is between 300 and 320 micrometers in height.

9. The system of claim 8, wherein the first microelectronic die is selected from a data storage device, a digital signal processor, a micro controller, an application specific integrated circuit, and a processor.

10. The system of claim 7, wherein the system is disposed in one of a computer, a wireless communicator, a hand-held device, an automobile, a locomotive, an aircraft, a watercraft, and a spacecraft.

* * * * *